United States Patent
Maeda et al.

(10) Patent No.: US 7,025,086 B2
(45) Date of Patent: Apr. 11, 2006

(54) REVERSE FLOW PREVENTING DEVICE AND ELECTRONIC APPARATUS

(75) Inventors: Hideki Maeda, Kawasaki (JP); Hikaru Inoue, Kawasaki (JP); Akira Shimasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/914,091

(22) Filed: Aug. 10, 2004

(65) Prior Publication Data

US 2005/0016595 A1 Jan. 27, 2005

Related U.S. Application Data

(63) Continuation of application No. PCT/JP02/02154, filed on Mar. 7, 2002.

(51) Int. Cl.
*F16K 15/03* (2006.01)
*F24F 7/007* (2006.01)

(52) U.S. Cl. .............. 137/512.1; 137/527.8; 454/353

(58) Field of Classification Search ......... 137/512.1, 137/527, 527.8; 454/259, 353
See application file for complete search history.

(56) References Cited

U.S. PATENT DOCUMENTS

| | | | | |
|---|---|---|---|---|
| 1,023,885 A * | 4/1912 | Smyth | ............ | 137/512.1 |
| 2,052,596 A * | 9/1936 | Barrett | ............ | 137/527.8 |
| 2,976,882 A * | 3/1961 | Cowan | ............ | 137/512.1 |
| 3,095,178 A * | 6/1963 | Veber | ............ | 137/512.1 |
| 3,118,467 A * | 1/1964 | Kuhn | ............ | 137/512.1 |
| 3,334,569 A * | 8/1967 | Lambie | ............ | 454/353 |
| 3,640,306 A * | 2/1972 | Vogt | ............ | 137/512.1 |
| 4,133,852 A * | 1/1979 | DiNicolantonio et al. | ............ | 137/513.3 |
| 4,779,518 A * | 10/1988 | Artwick et al. | ............ | 454/353 |
| 4,887,522 A * | 12/1989 | Kuno et al. | ............ | 454/309 |
| 5,090,445 A * | 2/1992 | Jackson | ............ | 137/527.8 |
| 5,222,519 A * | 6/1993 | Sato et al. | ............ | 137/512.1 |
| 5,259,411 A * | 11/1993 | Guzorek | ............ | 137/527.8 |
| 5,392,812 A * | 2/1995 | Herron | ............ | 137/527.8 |
| 6,011,689 A * | 1/2000 | Wrycraft | ............ | 454/353 |
| 6,135,875 A * | 10/2000 | French | ............ | 454/184 |
| 6,174,232 B1 * | 1/2001 | Stoll et al. | ............ | 454/184 |
| 6,181,557 B1 * | 1/2001 | Gatti | ............ | 454/184 |
| 6,273,127 B1 * | 8/2001 | Wade | ............ | 137/512.15 |
| 6,554,698 B1 * | 4/2003 | Kranzdorf et al. | ............ | 454/184 |

FOREIGN PATENT DOCUMENTS

| | | |
|---|---|---|
| EP | 844443 A2 | 5/1998 |
| JP | 50-95802 | 7/1975 |
| JP | 58-184067 | 12/1983 |
| JP | 59-38635 | 3/1984 |
| JP | 5-66456 | 9/1993 |
| JP | 3004775 | 11/1994 |
| JP | 9-126191 | 5/1997 |
| JP | 11-22698 | 1/1999 |
| JP | 2001-257495 | 9/2001 |

* cited by examiner

*Primary Examiner*—John Rivell
(74) *Attorney, Agent, or Firm*—Armstrong, Kratz, Quintos, Hanson & Brooks, LPP.

(57) ABSTRACT

A reverse flow preventing device arranged in a flow path of fluid formed by a fan and an electronic apparatus equipped with the same. The reverse flow preventing device has a frame, a plurality of support shafts arranged about the center of the frame and mounted on the frame, and a plurality of pivotable plate members supported by the support shafts. The plate members can move between the first position (reverse flow preventing position) in which they lie in a substantially single plane and the second position (normal operating position) in which they move. The support shafts and the plate members are arranged substantially concentrically or radially.

11 Claims, 7 Drawing Sheets

REVERSE FLOW PREVENTING DEVICE AND ELECTRONIC APPARATUS

CROSS-REFERENCE TO RELATED APPLICATIONS

This is a continuation of PCT/JP02/02154, filed on Mar. 7, 2002, the contents thereof being incorporated therein by reference.

TECHNICAL FIELD

The present invention relates to a reverse flow preventing device arranged on a suction side or a discharge side of a fan unit and an electronic apparatus comprising such a reverse flow preventing device.

BACKGROUND ART

Recent electronic apparatuses include an electric/electronic part, and a plurality of axial flow fans for cooling the electric/electronic part. For example, two axial flow fans are arranged side-by-side in a common duct. In this case, if one axial flow fan stops due to a problem, the entire cooling ability greatly drops because the axial flow fan cannot discharge the cooling air but also the cooling air discharged by another axial flow fan can reversely flow through the stopped axial flow fan. Therefore, there is a proposal to arrange a reverse flow preventing device on the discharge side of an axial flow fan, so that if one axial flow fan stops, the cooling air-discharged by another axial flow fan does not reversely flow through the stopped axial flow fan.

For example, Japanese Unexamined Patent Publication (Kokai) No. 50-95802 discloses a fan unit comprising an axial flow fan and a reverse flow preventing plate of a plastic sheet arranged on the discharge side of the axial flow fan. A portion of the reverse flow preventing plate is fixed to the fan unit and the remaining portion of the reverse flow preventing plate is elastically deformable. When the axial flow fan is operated, the reverse flow preventing plate elastically deforms, upon receiving the force produced by the axial flow fan, whereby a flow passage is formed between the axial flow fan and the reverse flow preventing plate. When the axial flow fan is stopped, the axial flow fan does not generate a flow of air and the reverse flow preventing plate returns to a position in which it covers the axial flow fan. Therefore, a flow of air which is apt to reversely flow through the axial flow fan is blocked by the reverse flow preventing plate.

In the case of the reverse flow preventing plate disclosed by this prior art, there is a problem in that the reverse flow preventing plate flaps in the flow of air produced by the axial flow fan while the axial flow fan is operated, and noise is produced.

Japanese Unexamined Patent Publication (Kokai) No. 9-126191 discloses an axial flow fan structure in which blades of the axial flow fan are constructed so as to have a functions of a fan itself and a function of a reverse flow prevention. The blades of the axial flow fan are movably attached to the rotation shaft of the axial flow fan via hinges. When the axial flow fan is operated, the blades of the axial flow fan move to a position in which they take a usual, generally spiral blade shape. When the axial flow fan is stopped, the blades of the axial flow fan move to a position in which they are generally perpendicular to the rotation axis, to thereby close the flow passage of the axial flow fan. It is difficult to fabricate the blades of the axial flow fan disclosed by this prior art, and there are problems of noise and cost if the blades are fabricated.

Japanese Unexamined Patent Publication (Kokai) No. 11-22698 discloses a fan device comprising an axial flow fan, and a reverse flow preventing device including louver-shaped plate members. In this case, all the louver-shaped plate members are arranged parallel to each other and form flow passages opening in constantly inclined directions relative to the axial flow fan, so the flow of air produced by the axial flow fan becomes a flow which is deflected in one direction, and problems of the reduction of the fan performance and the increase in noise occur.

SUMMARY OF THE INVENTION

The object of the present invention is to provide a reverse flow preventing device and an electronic apparatus in which a flow of air produced by a fan is not obstructed when the fan is operated and a reverse flow to the fan is securely prevented when the fan is stopped.

In order to achieve the above mentioned object, a reverse flow preventing device arranged in a flow path of fluid formed by a fan, according to the present invention, comprises a frame, a plurality of support shafts arranged about a center of the frame and mounted on the frame, and a plurality of pivotable plate members supported by the support shafts.

In this arrangement, when the fan is operated, the plate members of the reverse flow preventing device receive a flow of air produced by the fan and rotate about the support shafts, to permit the flow of air produced by the fan. A plurality of support shafts are arranged about the center of the frame at various angles, and the plate members of the reverse flow preventing device do not obstruct the flow of air produced by the fan. When the fan is stopped, no flow of air is produced by the fan, and the plate members of the reverse flow preventing device rotate about the support shafts to thereby prevent a reverse flow of air directed toward to the fan.

Preferably, said frame has a central portion, a peripheral portion arranged about the central portion and spaced apart from the central portion, and connecting portions arranged between the central portion and the peripheral portion.

In one preferred mode, said support shaft is mounted on two connecting portions. In this case, preferably, said support shaft extends substantially perpendicular to a line extending radially from the center of the frame. Also, the plate members are substantially concentrically arranged.

In another preferred mode, said support shafts are radially arranged on the central portion and the peripheral portion. In this case, preferably, said plate members are radially arranged.

Preferably, said plate member has a first portion and a second portion divided by the support shaft, the center of gravity of the plate member lies on the first portion. The plate member has a weight at the second portion. Said plate member is curved in the first portion. Said plate member is curved to protrude in the direction of the flow of air produced by a fan. Said plate member includes a stopper for abutment against the frame. Said plate members can move between a first position in which they lie in a substantially single plane and a second position in which they get up toward the side opposite to an axial fan. Said device further comprises an elastic member biasing the plate member toward the first position.

In addition, the present invention provides an electronic apparatus comprising an electronic apparatus casing including an electronic part, a fan, and an above-mentioned reverse flow preventing device arranged in a flow path of fluid formed by the fan.

BRIEF DESCRIPTION OF THE DRAWINGS

The present invention will now be explained with reference to the accompanying drawings, in which.

BEST MODE FOR CARRYING OUT THE INVENTION

Figure 1:
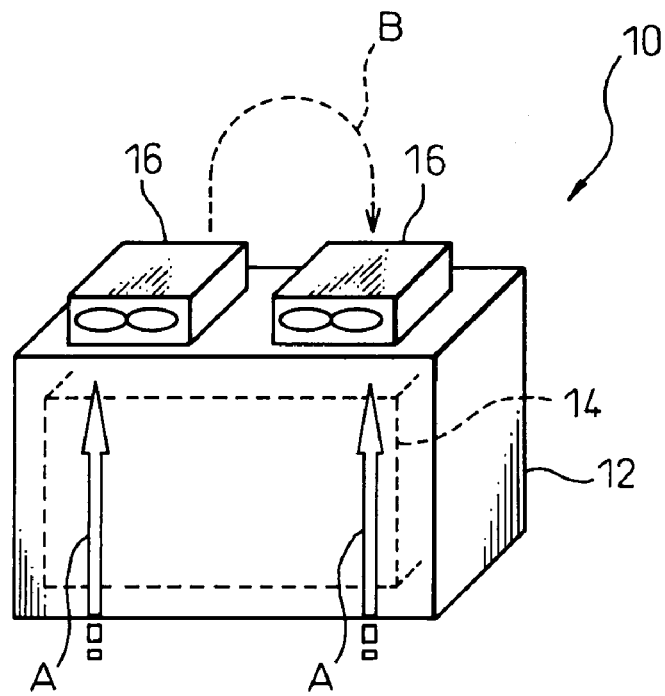
FIG. 1 is a schematic perspective view showing an electronic apparatus having an axial flow fan and a reverse flow preventing device.

FIG. 1 is a schematic perspective view showing an electronic apparatus having an axial flow fan and a reverse flow preventing device, according to the present invention. The electronic apparatus has a casing 12 in which an electric/electronic part 14 is accommodated. Two fan units 16 are arranged side-by-side on one side (upper side in FIG. 1) of the casing 12. Two fan units 16 are arranged together in a not-shown duct. Arrow A shows a flow of cooling air produced by the fan units 16 and passing through the casing 12. Broken arrow B shows a reverse flow of cooling air directed from one fan unit 16 to another fan unit 16 when a fan of one fan unit 16 is stopped. In the present invention, a reverse flow preventing device is provided to prevent this reverse flow.

Figure 2:
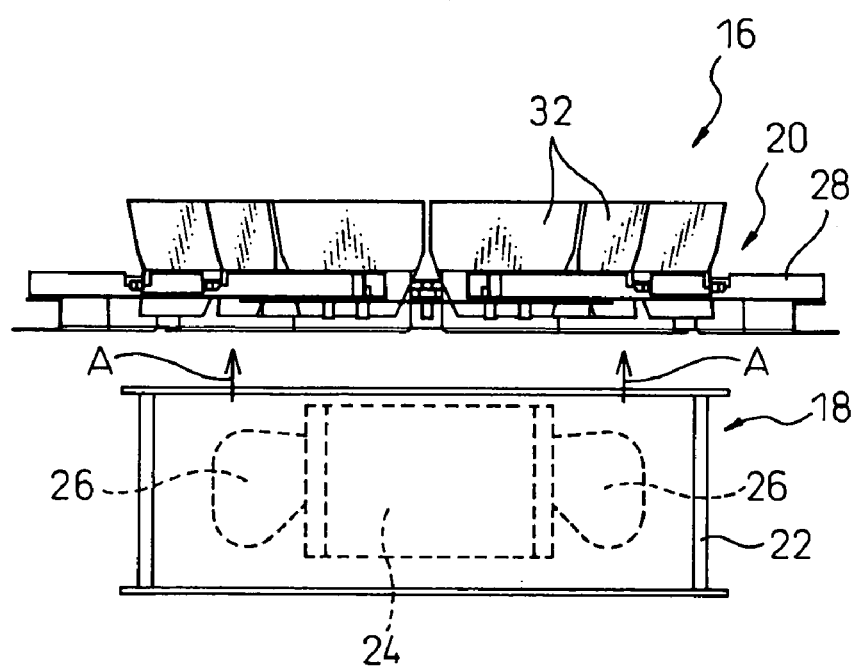
FIG. 2 is a schematic side view showing the fan unit of FIG. 1 having an axial flow fan and a reverse flow preventing device, according to the first embodiment of the present invention.

FIG. 2 is a schematic side view showing the fan unit 16 of FIG. 1 having an axial flow fan and a reverse flow preventing device, according to the first embodiment of the present invention. The fan unit 16 has an axial flow fan 18 and a reverse flow preventing device 20 arranged on the discharge side of the axial flow fan 18. The axial flow fan 18 has a fan case 22, a motor 24 fixed to the central portion of the fan case 22, and blades 26 coupled to the rotor of the motor 24.

Figure 3:
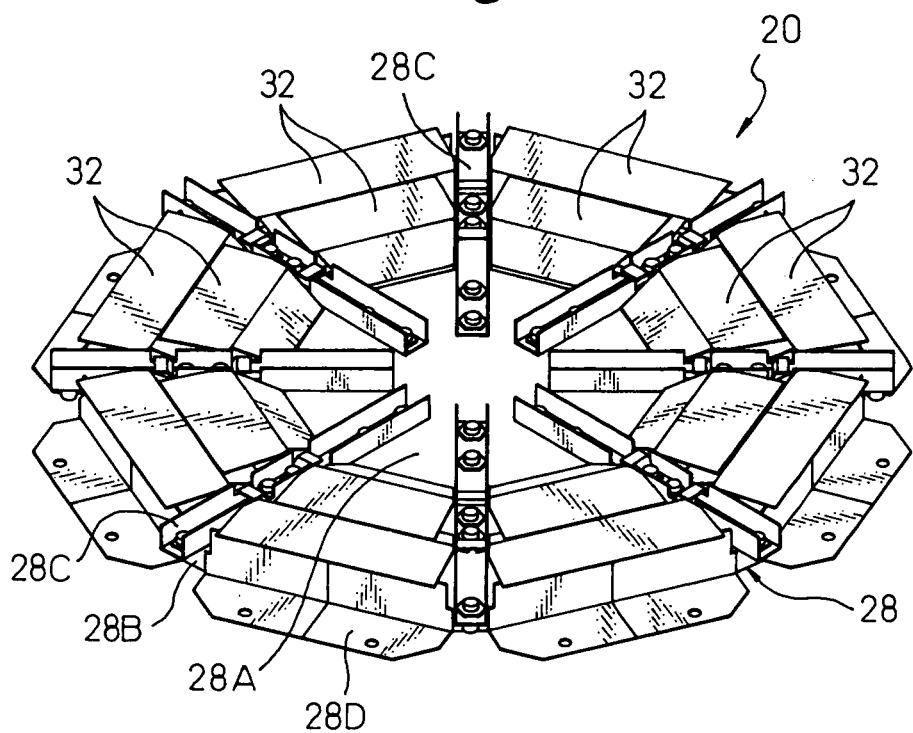
FIG. 3 is a perspective view showing the reverse flow preventing device when the axial flow fan of FIG. 2 is stopped.
Figure 4:
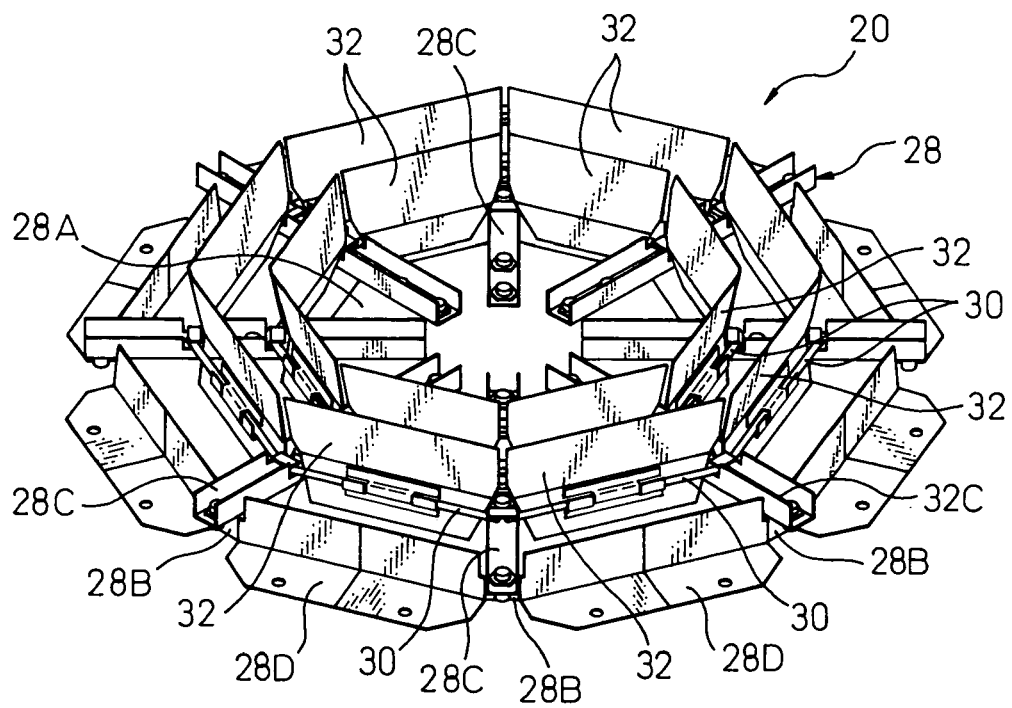
FIG. 4 is a perspective view showing the reverse flow preventing device when the axial flow fan of FIG. 2 is operated.

FIG. 3 is a perspective view showing the reverse flow preventing device 20 when the axial flow fan 18 of FIG. 2 is stopped. FIG. 4 is a perspective view showing the reverse flow preventing device 20 when the axial flow fan 18 of FIG. 2 is operated.

In FIGS. 2 to 4, the reverse flow preventing device 20 comprises a frame 28, a plurality of support shafts 30 arranged about the center of the frame 28 and mounted on the frame 28, and a plurality of pivotable plate members 32 respectively supported by the support shafts 30. In FIG. 3, all the plate members 32 are in the first position (reverse flow preventing position) in which they lie in a substantially single plane. In FIG. 4, all the plate members 32 are in the second position (normal operating position) in which they move toward the side opposite to the axial flow fan 18. The plate members 32 are made of a relatively rigid material such as metal.

In this arrangement, when the axial flow fan 18 is operated, the plate members 32 of the reverse flow preventing device 20 receives a flow of air produced by the axial flow fan 18 and rotate about the support shafts 30, to permit the flow of air produced by the axial flow fan 18 (FIG. 4). A plurality of support shafts 30 are arranged about the center of the frame 28 at various angles, and the plate members 32 of the reverse flow preventing device 20 do not obstruct the flow of air produced by the axial flow fan 18. When the axial flow fan 18 is stopped, no flow of air is produced by the axial flow fan 18, and the plate members 32 of the reverse flow preventing device 20 rotate about the support shafts 30 under the gravity to thereby prevent the reverse flow of air directed toward to the axial flow fan 18 (FIG. 3).

In particular, the frame 28 has a central portion 28A, a peripheral portion 28B arranged about the central portion 28A and spaced apart from the central portion 28A, and connecting portions 28C arranged between the central portion 28A and the peripheral portion 28B. Peripheral blade members 28D are attached to the peripheral portion 28B. The central portion 28A is located above the motor 24 of the axial flow fan 18, and the peripheral portion 28B is located above the fan case 22 of the axial flow fan 18. Therefore, the frame 28 does not obstruct the flow of air produced by the axial flow fan 18.

Two adjacent connecting portions 28C form a substantially sector-shaped space. The support shafts 30 are attached to adjacent two connecting portions 28C. In this case, the support shafts 30 extend substantially perpendicular (generally circumferentially) to a line extending radially from the center of the frame 28 (median of two sides of a sector). In the preferred embodiment, two plate members 32 are arranged in the above-mentioned sector space and all the plate members 32 are substantially concentrically arranged.

The flow of air produced by the axial flow fan 18 is the combination of a component in the axial direction of the fan case 22 of the axial flow fan 18, a component in the radially outward direction, and a component in the circumferential direction. As shown in FIG. 4, in the condition in which the plate members 32 of the reverse flow preventing device 20 are substantially concentrically arranged and get up toward the side opposite to the axial flow fan 18, the plate members 32 are arranged substantially parallel to the flow of fluid comprised of the combination of a component in the axial direction and a component in the circumferential direction, so the plate members 32 do not practically obstruct the flow of air produced by the axial flow fan 18. Also, the plate members 32 do not flap or flutter in the flow of air produced by the axial flow fan, and no noise is produced. Also, the reverse flow preventing device 20 can be reliably fabricated.

Figure 6:
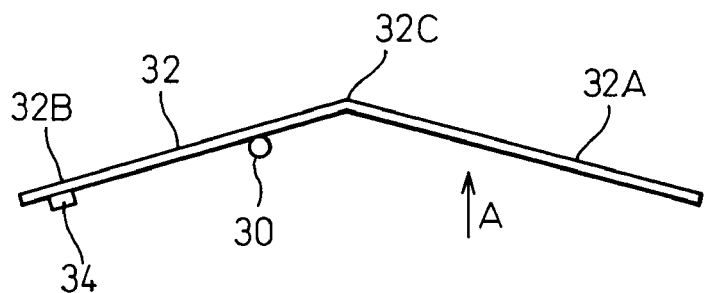
FIG. 6 is a side view showing an example of the plate member of the reverse flow preventing device.
Figure 7:
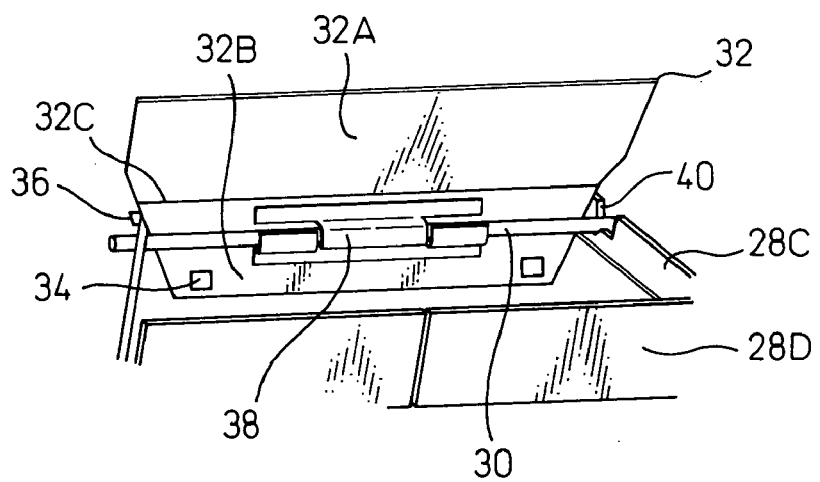
FIG. 7 is a perspective view showing the plate member and the connecting portion of the frame of the reverse flow preventing device of FIG. 6.
Figure 8:
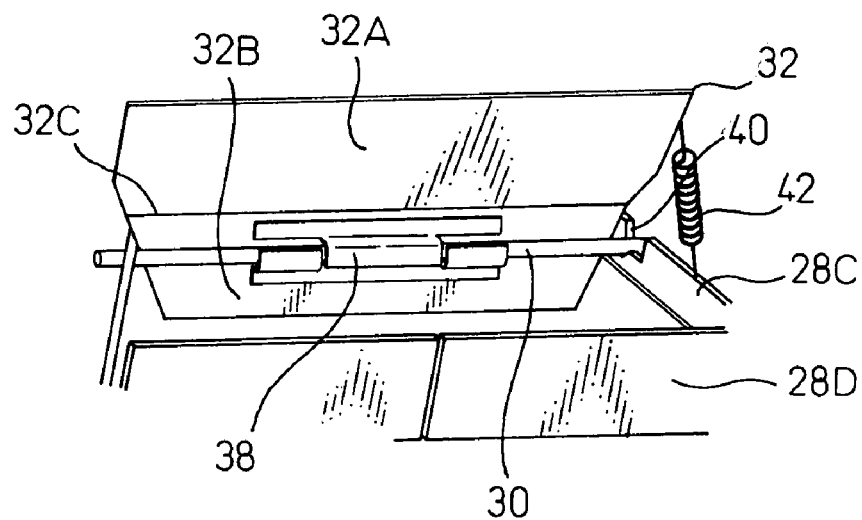
FIG. 8 is a perspective view showing the an example of the plate member of the reverse flow preventing device.

FIGS. 5 to 8 are views showing examples of the plate member 32 of the reverse flow preventing device 20. In FIG. 8, the plate member 32 is made of a flat plate. The support shaft 30 is attached to the plate member 32 at a position shifted from the center of the plate member 32. That is, the plate member 32 has a first plate portion 32A and a second plate portion 32B divided by the support shaft 30, the center of gravity G of the plate member 32 lies on the first plate portion 32A. In the case where the plate member 32 has a constant width, the length of the first plate portion 32A is longer than that of the second plate portion 32B.

The plate member 32 rotates about the support shaft 30, as shown by the arrow C, by the flow of the cooling air A produced by the axial flow fan 18. The first plate portion 32A having a larger area is directed vertically upward. By attaching the support shaft 30 to the plate member 32 at a position shifted from the center of the plate member 32, the plate member 32 can easily rotate by the flow of the cooling air A. For example, if the position of the support shaft 30 is at the center of the plate member 32, the area of the first plate portion 32A is the same as that of the second plate portion 32B and both plate portions receive the identical pressure, so the plate member 32 does not rotate. If the position of the support shaft 30 is at one end of the plate member 32, a greater rotation moment is necessary to rotate the plate member 32.

FIG. 6 is a side view showing an example of the plate member 32 of the reverse flow preventing device 20, and FIG. 7 is a perspective view showing the plate member 32 and the connecting portion 28C of the frame 28 of the reverse flow preventing device 20 of FIG. 6. In FIGS. 6 and 7, the plate member 32 has a first plate portion 32A and a second plate portion 32B divided by the support shaft 30, the center of gravity of the plate member 32 lies on the first plate portion 32A. The plate member 32 is curved in the first plate portion 32A (curved portion 32C). The plate member 32 is curved to protrude in the direction of the flow of the cooling air produced by the axial flow fan 18, so that the plate member 32 can receive the wind to thereby easily rotate. The plate member 32 has a weight 34 at the second plate portion 32B. The plate member 32 includes at its side a stopper member 36 for abutment against the frame 28.

The support shaft 30 is attached to the plate member 32 by a clamp 38. The connecting portion 28C of the frame 28 has a bearing hole 40 and the end of the support shaft 30 is supported in the bearing hole 40. The bearing hole 40 is closed by a not shown cover. The stopper member 36 abuts against the connecting portion 32C of the frame 28 when the plate member 32 is in the vertical position, so that the plate member 32 is maintained in the vertical position. The weight 34 adds a weight to the second plate portion 32B having a smaller area so as to reduce the rotation moment of the plate member 32.

Figure 5:
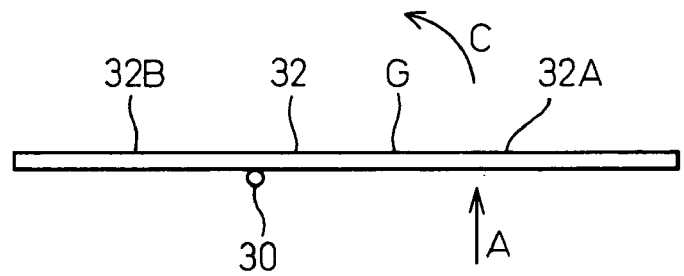
FIG. 5 is a side view showing an example of the plate member of the reverse flow preventing device.

The plate member 32 shown in FIGS. 3 to 5 is similar to the plate member 32 shown in FIGS. 6 and 7. The plate member 32 is formed in such a shape comprising the combination of a rectangle and a trapezoid in correspondence with the sector space formed by the adjacent two connecting portions 28C of the frame 28. The support shaft 30 is attached to the portion of the trapezoid of the plate member 32. In the case where the plate members 32 lie in a single plane, as shown in FIG. 3, the portion of the trapezoid is located on the side of the central portion 28A of the frame 28, and the portion of the rectangle is located on the side of the peripheral portion 28B. The sizes of two plate members 32 located in one sector space are different from each other, wherein the smaller plate member 32 is located on the side of the central portion 28A of the frame 28, and the larger plate member 32 is located on the side of the peripheral portion 28B. In this way, in the case where all the plate members 32 lie in one plane, all the plate members 32 and the frame 28 become one plate having no opening, and prevent the reverse flow. However, the plate members 32 and the frame 28 can be constructed to make a small opening. By making a small opening, it is possible to release heat when the axial flow fan 18 is stopped.

FIG. 8 is a perspective view showing the an example of the plate member 32 of the reverse flow preventing device 20. This plate member 32 is similar to the plate member 32 of FIG. 7. In FIG. 8, a spring 42 is arranged between the plate member 32 and the connecting portion 28C of the frame 28, so that the plate member 32 is returned to the position of FIG. 3, not only by the weight of the plate member 32 but also by the spring 42.

Figure 9:
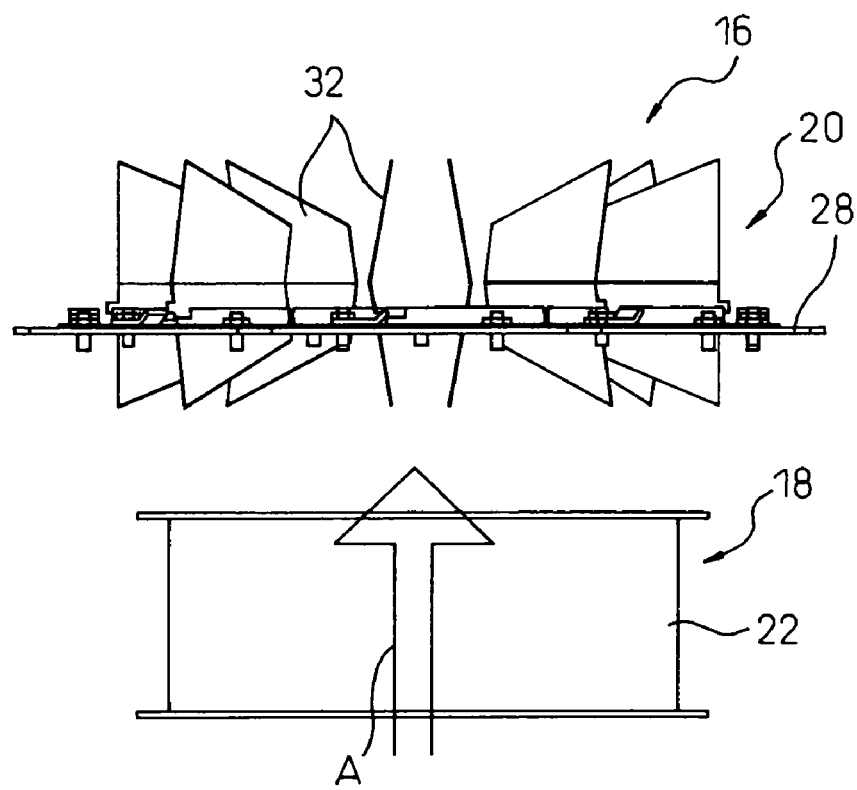
FIG. 9 is a schematic perspective view showing the fan unit of FIG. 1 having an axial flow fan and a reverse flow preventing device, according to the second embodiment of the present invention.
Figure 10:
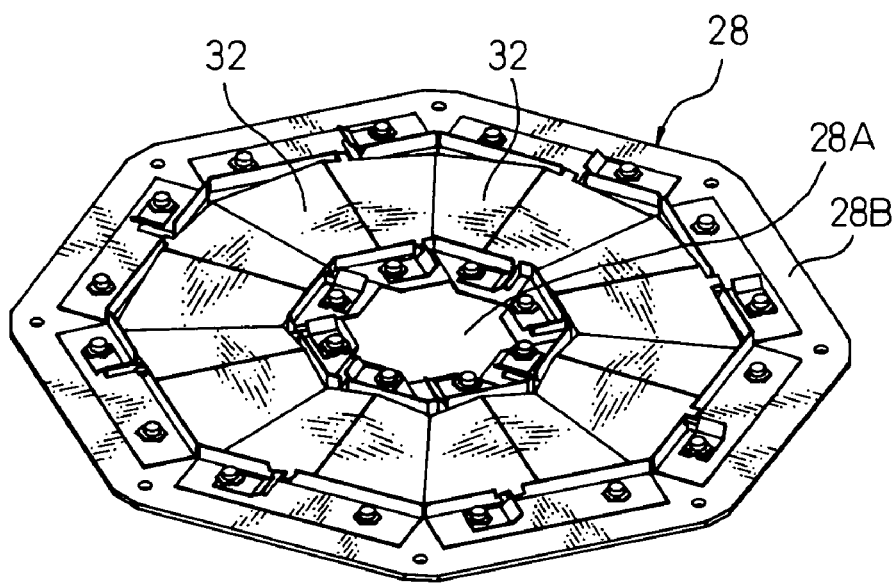
FIG. 10 is a perspective view showing the reverse flow preventing device when the axial flow fan of FIG. 9 is stopped.
Figure 11:
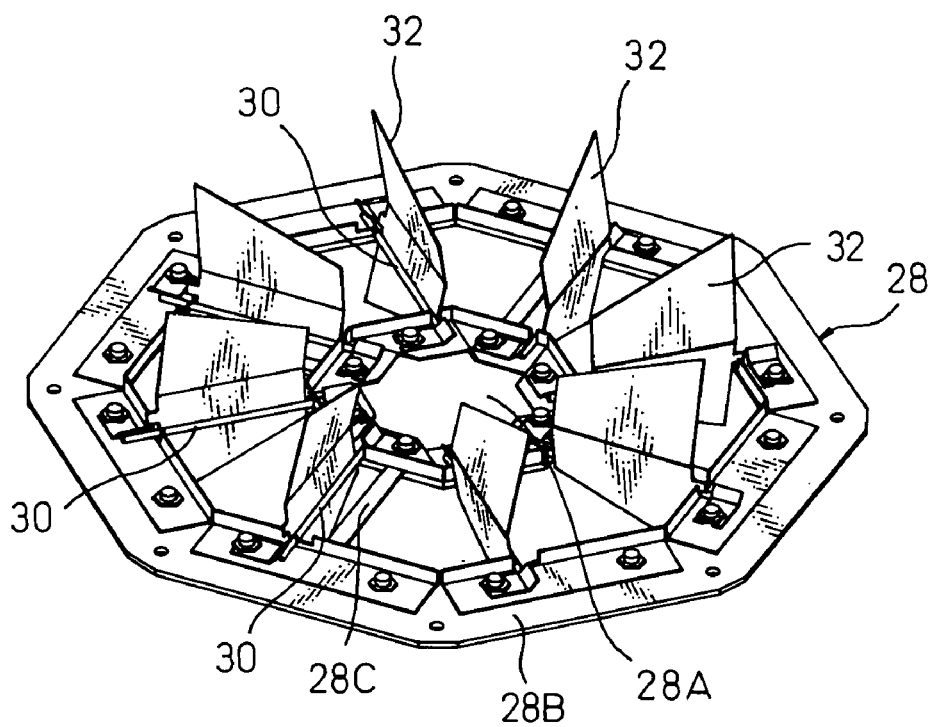
FIG. 11 is a perspective view showing the reverse flow preventing device when the axial flow fan of FIG. 9 is operated.

FIGS. 9 to 11 are views showing the reverse flow preventing device, according to the second embodiment of the present invention. FIG. 9 is a schematic perspective view showing the fan unit of FIG. 1 having an axial flow fan and a reverse flow preventing device. FIG. 10 is a perspective view showing the reverse flow preventing device when the axial flow fan of FIG. 9 is stopped. FIG. 11 is a perspective view showing the reverse flow preventing device when the axial flow fan of FIG. 9 is operated.

In FIGS. 9 to 11, the fan unit 16 has an axial flow fan 18 and a reverse flow preventing device 20 arranged on the discharge side of the axial flow fan 18. The axial flow fan 18 has a fan case 22, a motor (not shown) fixed to the central portion of the fan case 22, and blades (not shown, refer to FIG. 2) coupled to the rotor of the motor 24.

In FIGS. 9 to 11, the reverse flow preventing device 20 comprises a frame 28, a plurality of support shafts 30 arranged about the center of the frame 28 and mounted on the frame 28, and a plurality of pivotable plate members 32 respectively supported by the support shafts 30. In FIG. 10, all the plate members 32 are in the first position in which they lie in a substantially single plane. In FIG. 11, all the plate members 32 are in the second position in which they move toward the side opposite to the axial flow fan 18.

Therefore, in this arrangement, when the axial flow fan 18 is operated, the plate members 32 of the reverse flow preventing device 20 receives a flow of air produced by the axial flow fan 18 and rotate about the support shafts 30, to permit the flow of air produced by the axial flow fan 18 (FIG. 11). A plurality of support shafts 30 are arranged about the center of the frame 28 at various angles, and the plate members 32 of the reverse flow preventing device 20 do not obstruct the flow of air produced by the axial flow fan 18. When the axial flow fan 18 is stopped, no flow of air is produced by the axial flow fan 18, and the plate members 32 of the reverse flow preventing device 20 rotate about the support shafts 30 under the gravity to thereby prevent the reverse flow of air directed toward to the axial flow fan 18 (FIG. 10).

The frame 28 has a central portion 28A, a peripheral portion 28B arranged about the central portion 28A and spaced apart from the central portion 28A, and connecting portions 28C arranged between the central portion 28A and the peripheral portion 28B. The central portion 28A is located above the motor 24 of the axial flow fan 18, and the peripheral portion 28B is located above the fan case 22 of the axial flow fan 18. Therefore, the frame 28 does not obstruct the flow of air produced by the axial flow fan 18.

In this embodiment, the support shafts 30 are radially attached to the central portion 28A and the peripheral portion 28B. The plate members 32 are radially arranged. As shown in FIG. 11, in the condition in which the plate members 32 of the reverse flow preventing device 20 are radially arranged and move toward the side opposite to the axial flow fan 18, the plate members 32 are arranged substantially parallel to the flow of fluid comprised of the combination of a component in the axial direction and a component in the radial direction, so the plate members 32 do not practically obstruct the flow of air produced by the axial flow fan 18. Also, the plate members 32 do not flap or flutter in the flow of air produced by the axial flow fan, and no noise is produced. Also, the reverse flow preventing device 20 can be reliably fabricated.

In the embodiment of FIGS. 9 to 11 too, the shape of the plate members 32 and the coupling relationship between the plate members 32 and the support shafts 30 may have characteristics explained with reference to FIGS. 5 to 8.

Figure 12:
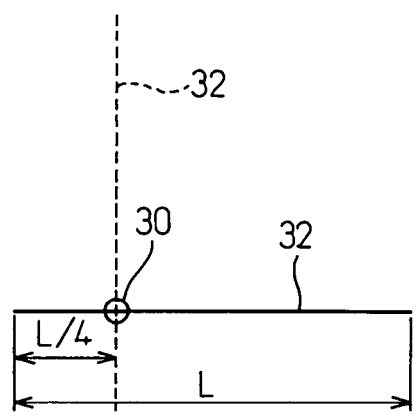
FIG. 12 is a side view illustrating an example of the plate member of the reverse flow preventing device according to the present invention.
Figure 13:
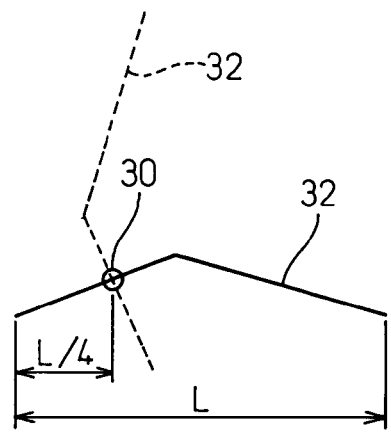
FIG. 13 is a side view illustrating an example of the plate member of the reverse flow preventing device according to the present invention.
Figure 14:
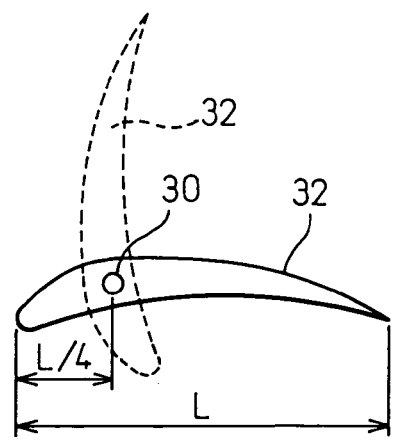
FIG. 14 is a side view illustrating an example of the plate member of the reverse flow preventing device according to the present invention.

FIGS. 12 to 14 are views showing examples of the plate member 32 of the reverse flow preventing device 20 according to the present invention. Broken line 32 shows the plate member 32 in the vertical position. FIG. 12 shows an example of the plate member 32 made of a flat plate. In this case, the support shaft 30 is preferably attached to the plate member 32 at a position of L/4 of the plate member 32, the length of which is L. FIG. 13 shows an example of the curved plate member 32. In this case, the support shaft 30 is preferably attached to the plate member 32 at a position of L/4 of the plate member 32, the length of which is L. FIG. 14 shows an example of the streamlined plate member 32. In this case, the support shaft 30 is preferably attached to the plate member 32 at a position of L/4 of the plate member 32, the length of which is L.

Figure 15:
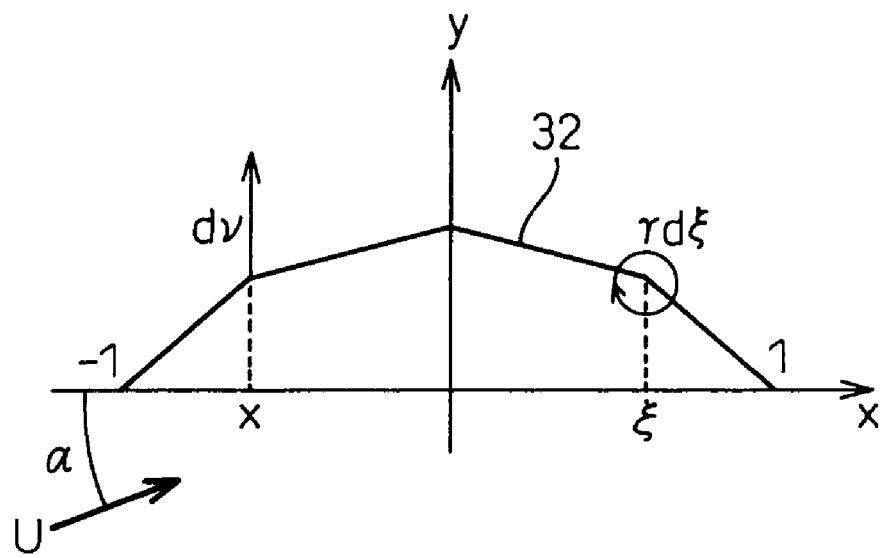
FIG. 15 is a view showing an example of a circular arc aerofoil as a model for analyzing the relationship between the plate member and the support shaft.
Figure 16:
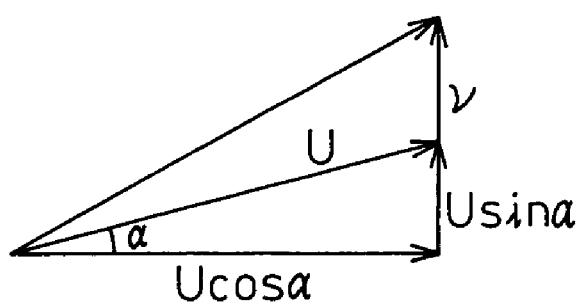
FIG. 16 is a view showing the relationship of the components of the speed.

FIG. 15 is a view showing an example of a circular arc aerofoil as a model for analyzing the relationship between the plate member and the support shaft. FIG. 16 is a view showing the relationship of the components of the speed.

In FIG. 15, U represents the speed of the flow, α represents the attack angle, the leading edge is represented by x=1, the trailing edge is represented by x=−1, and y represents the circular arc aerofoil section. The speed dv in the y direction at the position of x, which is caused by the vortex γdξ at the position of ξ, and the speed v caused by the total vortex are expressed by the following equations, where the aerofoil is substituted by the distribution of the vortex, and the distribution of the vortex is represented by γ.

$$dv = \frac{1}{2\pi} \frac{\gamma}{\xi - x} dx \quad (1)$$

$$v = \frac{1}{2\pi} \int_{-1}^{1} \frac{\gamma}{\xi - x} dx \quad (2)$$

Here, the variables are substituted in the following manner and the condition of Kutta is applied, the distribution of the vortex being represented by the equation (4).

$\xi = \cos\theta \quad 0 \leq \theta \leq \pi$ $x = \cos\phi \quad 0 \leq \phi \leq \pi$ $\gamma(0) = 0 \quad \text{Condition of Kutta} \quad (3)$ $$\gamma = U\left(a_0 \tan\frac{\theta}{2} + a_1 \sin\theta + a_2 \sin 2\theta + \ldots\right) \quad (4)$$

From the equations (2), (3) and (4), the speed v is expressed by the equation (5).

$$v = \frac{U}{2\pi} \int_0^\pi \frac{1}{\cos\theta - \cos\phi}\left(a_0 \tan\frac{\theta}{2} + a_1 \sin\theta + a_2 \sin 2\theta + \ldots\right)\sin\theta d\theta \quad (5)$$

$$= -U\left\{\frac{a_0}{2} + \frac{a_1}{2}\cos\phi - \frac{a_2}{2}(1 - 2\cos^2\phi) + \ldots\right\}$$

$$= -U\left\{\frac{a_0}{2} + \frac{a_1}{2}x - \frac{a_2}{2}(1 - 2x^2) + \ldots\right\}$$

The resultant speed of U and v on the aerofoil surface must coincide with the aerofoil direction, and if α is small, the equation (6) is formulated.

$$\frac{dy}{dx} = \frac{U\sin\alpha + v}{U\cos\alpha} \approx \alpha + \frac{v}{U} \quad (6)$$

$$= \alpha - \frac{a_0}{2} - \frac{a_1}{2}x + \frac{a_2}{2}(1 - 2x^2) + \ldots$$

Therefore, the aerofoil section is expressed by the following equation.

$$y = \alpha x - \frac{a_0}{2}x - \frac{a_1}{4}x^2 + \frac{a^2}{2}\left(x - \frac{2}{3}x^3\right) + \ldots + C \quad (7)$$

In the case of a circular arc aerofoil, $a_2 = a_3 = \ldots = 0$ are inserted, and the conditions at the leading and trailing edges are applied.

$y = \alpha x - (a_0/2)x - (a_1/4)x^2 + C$ $0 = -\alpha + (a_0/2) - (a_1/4) + C \quad \text{Leading Edge}$ $0 = \alpha - (a_0/2) - (a_1/4) + C \quad \text{Trailing Edge}$ $\therefore c = (a_1/4), a_0 = 2\alpha$ Therefore, the aerofoil section of the circular arc aerofoil is expressed by the following equation.

$y = (a_1/4)(1 - x^2)x$ $\text{Maximum Camber:} (f/c) = (a_1/8) \quad (8)$

In this case, the moment $M_0$ about the origin, the moment $M_{1.e.}$ about the leading edge, and the moment $M_{25\%}$ about the aerodynamic center are expressed by the following equations, respectively.

$$M_0 = -\int_{-1}^{1} \rho U \gamma x dx \qquad (9)$$
$$= -\pi \rho U^2 \alpha$$

$$M_{1.e.} = -\int_{-1}^{1} \rho U \gamma (x+1) dx \qquad (10)$$
$$= -\pi \rho U^2 \alpha - 4\pi \rho U^2 \frac{f}{c}$$

$$M_{25\%} = \int_{-1}^{1} \rho U \gamma (x+0.5) dx \qquad (11)$$
$$= -2\pi \rho U^2 \frac{f}{c}$$

Equations (9) and (10) include the attack angle $\alpha$, but the equation (11) does not include the attack angle $\alpha$ and is determined only by the aerofoil section and the flow speed. That is, it should be understood that a more stable tendency with respect to the variation in the flow field is realized.

Incidentally, the above explained tendency can be realized not only for the circular arc aerofoil but a similar tendency can be realized for a general aerofoil section.

INDUSTRIAL APPLICABILITY

As explained above, according to the present invention, it is possible to obtain a reverse flow preventing device and an electronic apparatus in which a flow of air produced by a fan is not obstructed when the fan is operated and a reverse flow to the fan is securely prevented when the fan is stopped.

The invention claimed is:

1. A reverse flow preventing device arranged in a flow path of fluid formed by a fan, said device comprising:
   a frame;
   a plurality of support shafts arranged about a center of said frame and mounted on said frame, said support shafts extending generally circumferentially about the center of said frame; and
   a plurality of pivotable plate members supported by said support shafts.

2. The device according to claim 1, wherein said frame has a central portion, a peripheral portion arranged about said central portion and spaced apart from said central portion, and connecting portions arranged between said central portion and said peripheral portion.

3. The device according to claim 1, wherein said plate member has a first plate portion and a second plate portion divided by said support shaft, the center of gravity of said plate member lies on said first plate portion.

4. The device according to claim 3, wherein said plate member has a weight at said second plate portion.

5. The device according to claim 3, wherein said plate member is curved in said first plate portion.

6. The device according to claim 3, wherein said plate member is curved to protrude in the direction of the flow of air produced by a fan.

7. The device according to claim 1, wherein said plate member includes a stopper for abutment against said frame.

8. A reverse flow preventing device arranged in a flow path of fluid formed by a fan, said device comprising:
   a frame;
   a plurality of support shafts arranged about a center of said frame and mounted on said frame; and
   a plurality of pivotable plate members supported by said support shafts, wherein said frame has a central portion, a peripheral portion arranged about said central portion and spaced apart from said central portion, and connecting portions arranged between said central portion and said peripheral portion, wherein said support shafts are mounted on two connecting portions.

9. The device according to claim 8, wherein said support shafts extend substantially perpendicular to a line extending radially from the center of said frame.

10. The device according to claim 9, wherein said plate members are substantially concentrically arranged.

11. An electronic apparatus comprising an electronic apparatus casing including an electronic part, a fan, and a reverse flow preventing device arranged in a flow path of fluid formed by said fan according to one of claims 1 to 10, and 3–7.

* * * * *